United States Patent [19]

Thiele

[11] Patent Number: 4,473,858
[45] Date of Patent: Sep. 25, 1984

[54] FIRING CIRCUIT FOR POWER THYRISTORS

[75] Inventor: Gerd Thiele, Erlangen, Fed. Rep. of Germany

[73] Assignee: Siemens Aktiengesellschaft, Munich, Fed. Rep. of Germany

[21] Appl. No.: 401,342

[22] Filed: Jul. 23, 1982

[30] Foreign Application Priority Data

Aug. 12, 1981 [DE] Fed. Rep. of Germany ....... 3131894

[51] Int. Cl.$^3$ .............................................. H02H 7/12
[52] U.S. Cl. .................................. 361/91; 307/252 T; 307/311; 361/111
[58] Field of Search .......................... 361/91, 110, 111; 307/252 N, 252 T, 311; 363/57, 58, 56, 54

[56] References Cited

U.S. PATENT DOCUMENTS

| 3,487,261 | 12/1969 | Boksjö et al. ..................... 363/54 X |
| 3,567,972 | 3/1971 | Faust . |
| 3,617,864 | 11/1971 | Senger ............................... 361/91 X |
| 3,662,250 | 5/1972 | Piccone et al. ...................... 321/11 |
| 3,836,994 | 7/1973 | Piccone et al. ...................... 357/38 |

FOREIGN PATENT DOCUMENTS

| 2154283 | 5/1972 | Fed. Rep. of Germany . |
| 2258112 | 11/1972 | Fed. Rep. of Germany ........ 361/91 |
| 2506021 | 8/1975 | Fed. Rep. of Germany ........ 361/91 |
| 2744961 | 4/1979 | Fed. Rep. of Germany ........ 361/91 |
| 1072740 | 6/1967 | United Kingdom .................. 363/54 |

OTHER PUBLICATIONS

"Siemens-Energietechnik 2" 1980, No. 10, p. 420.

Primary Examiner—Harry E. Moose, Jr.
Attorney, Agent, or Firm—Kenyon & Kenyon

[57] ABSTRACT

A firing circuit for two antiparallel-connected power thyristors. Each of the power thyristors has a gate terminal; the gate terminals being connected by a series combination of auxiliary thyristors. Each of the auxiliary thyristors is of the type which can withstand firing resulting from excessive anode cathode potential; the sum total of the anode cathode potentials of the series-connected auxiliary thyristors being less than the anode-cathode breakdown voltages of the power thyristors. This, while a power thyristor is in a nonconductive state, an anode-cathode voltage is impressed thereacross in the forward conduction direction. At an anode-cathode voltage which is less than the breakdown voltage of the power thyristor, the auxiliary thyristors are fired so as to form a conductive path which includes the cathode-gate path of the other power thyristor, the auxiliary thyristors, and the gate-cathode path of the protected thyristor. Normal firing of the power thyristor is achieved via the auxiliary thyristors, which may be fired by light pulses or current pulses. Thus, the auxiliary thyristors perform protective and normal firing operations.

6 Claims, 3 Drawing Figures

FIRING CIRCUIT FOR POWER THYRISTORS

BACKGROUND OF THE INVENTION

This invention relates generally to firing circuits for power thyristors, and more particularly, to a firing circuit wherein the gate of the firing thyristor is connected to the first terminal of at least one auxiliary thyristor, the breakover voltage of which is smaller than the breakover voltage of the power thyristor, and which is fired by normal firing pulses.

A firing circuit which is provided with an auxiliary thyristor which is connected to the gate terminal of a power thyristor is described in U.S. Pat. Nos. 3,836,994 and 3,662,250. In the known arrangement, the anode-cathode path of the power thyristor is shunted by a series circuit consisting of an overvoltage detecting device and an energy storage device. The junction points of these two devices is connected to the gate of the power thyristor. If an excessively high voltage is applied to the power thyristor, the overvoltage detecting device becomes conductive and provides a trigger singal to the gate of the power thyristor. The power thyristor is fired before the applied voltage can reach a critical value. The gate current which is supplied by the overvoltage detecting device rises initially very steeply, because the energy storage device has an inductance which prevents it from drawing current rapidly. A portion of the current which is supplied by the overvoltage protecting device is conducted to the energy storage device only after a predetermined amount of time delay. If the voltage at the power thyristor breaks down, the energy storage device serves as a current source for addressing the power thyristor, and thereby maintains a trigger signal of sufficient amplitude and duration to assure the switching-on of the power thyristor. The overvoltage detecting device can be constructed with one or more series-connected auxiliary thyristors. The firing pulses for normal firing can then be conducted to the gates of the auxiliary thyristors, such that normal firing is accomplished via the auxiliary thyristors.

The known circuit is suitable for servicing several power thyristors which are connected in parallel with the same direction of conduction. If, however, the thyristor device is to be operated in two current directions, the power thyristors must be connected antiparallel. In this case, the known firing circuit becomes relatively complicated since the entire firing circuit, with the overvoltage detecting device and the energy storage device, must be provided in duplicate.

A firing circuit for a power thyristor having a gate which is connected to a first terminal of a threshold element for the protective firing of the power thyristor in the event of an overvoltage is described in the journal "Siemens-Energietechnik 2" 1980, no. 10, page 420. A second terminal of the threshold element having threshold voltage characteristic which is smaller than the zero breakover voltage of the power thyristor receives the anode voltage of the power thyristor. The firing command for the power thyristor is transmitted in the form of light pulses via high-voltage-proof light guides from ground potential to the thyristor potential; which firing command is converted via a receiving circuit into electric driving pulses for the power thyristor. The energy required for driving the thyristor is obtained from the anode-cathode voltage thereof. In order to protect the power thyristor in the event that the zero breakover voltage is exceeded, a breakover diode is connected between the anode and the gate of the power thyristor. If a voltage threshold is exceeded, this diode becomes conductive and delivers, regardless of a normal drive of the power thyristor, a driving pulse which switches the power thyristor into conduction and thereby allows the voltage present to be reduced. In this manner, a highly effective protection of the power thyristor is obtained for positive overvoltages. In addition, the reliability of the thyristor valve is increased if several power thyristors are connected in series in a thyristor valve. This results from the fact that even if the driver circuitry is defective the corresponding power thyristor continues to participate in the operation of the thyristor valve without undue overstress because it is fired at the same time with the firing of the other power thyristors of the thyristor valve by the overvoltage. In this known circuit arrangement, therefore, separate components are required for normal firing and for protective firing in the event of overvoltage.

It is, therefore, an object of this invention to provide a firing circuit of the type discussed hereinabove wherein the firing of anti-parallel connected power thyristors is achieved without undue expense and circuit complexity.

SUMMARY OF THE INVENTION

The foregoing and other objects are achieved by this invention which provides a power thyristor firing circuit wherein the power thyristor is provided with at least one further power thyristor which is connected in parallel with the first power thyristor, and electrically oriented anti-parallel so that the further power thyristor is biased for forward conduction in the direction opposite to that of the first power thyristor. In accordance with the invention, there are further provided first and second auxiliary thyristors which are each connected to the gate terminal of a respective one of the first and further power thyristors. The auxiliary thyristors are operated in response to conventional firing pulses.

In operation, the power thyristor which is connected in the direction of conduction is fired by the auxiliary thryistors if the voltage across the anode and cathode terminals of the power thyristor exceeds the zero breakdown voltage of the auxiliary thyristors. In this manner, the imperiled power thyristor is fired in response to its anode voltage via the gate-cathode path of the second path thyristor. The auxiliary thyristors must be of a type which is not damaged when it is fired by a sufficiently high voltage across the anode and cathode terminals. Such thyristors are known as being "overhead firing-proof" and are available for small power ratings. Thus, such overhead firing-proof thyristors are not available in the power ranges required for the power thyristors in the present invention. In addition to firing in the event of the overvoltage to protect a power thyristor, the auxiliary thyristors also serve to fire in a normal manner their respective power thyristors which are in the same direction of conduction. The auxiliary thyristors apply the normal firing pulses to the gate of the power thyristors in the same direction of conduction.

It is, therefore, a feature of this invention that antiparallel-connected power thyristors can be fired in normal operation with a simple, inexpensive circuit which simultaneously protects the thyristors against destructive overvoltage.

In an alternative embodiment of the invention, a further power thyristor is connected antiparallel to the power thyristor, and a rectifier bridge circuit is connected at the input terminals of the gates of the two power thyristors. An auxiliary thyristor is connected to the outputs of the rectifier bridge circuit. The operation of this further embodiment is similar to the operation of the embodiment described hereinabove, however, only one auxiliary thyristor is required because the auxiliary thyristor is always operated in its direction of conduction as a result of the operation of the rectifier bridge circuit.

In a still further embodiment of the invention, a Triac can be utilized instead of two antiparallel-connected auxiliary thyristors.

In the firing circuits of the two antiparallel-connected power thyristors, the gate-cathode path of each such power thyristor can be shunted by an antiparallel-connected diode. In this manner, the firing current does not flow in the reverse direction through the gate-cathode path of the respective antiparallel-connected power thyristor, but rather through the antiparallel-connected diode.

It is a further feature of this invention that several auxiliary thyristors may be connected in series. In this manner, the breakdown voltages of the individual auxiliary thyristors are added to each other so as to provide an effective breakdown voltage which can be determined by the number of series-connected auxiliary thyristors.

In a still further embodiment of the invention, each auxiliary thyristor is shunted by a resistor. Such resistors provide a controlled voltage division in the series circuit of the auxiliary thyristors.

In one advantageous embodiment, each auxiliary thyristor is driven by light pulses, as normal firing pulses. The use of such a direct light pulse drive for the auxiliary thyristors substantially reduces the cost of the firing circuit. Only a few auxiliary thyristors are required for the protective firing as well as for normal firing of the power thyristors.

BRIEF DESCRIPTION OF THE DRAWINGS

Comprehension of the invention is faciliated by reading the following detailed description in conjunction with the annexed drawings, in which.

DETAILED DESCRIPTION

Figure 1:
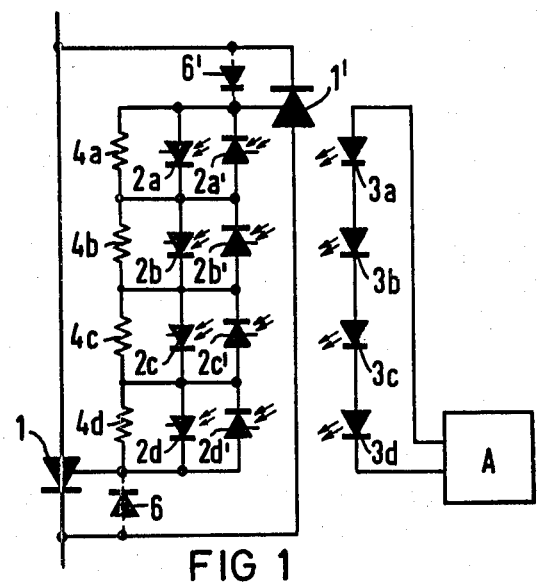
FIG. 1 is a block and schematic representation of one embodiment of the invention wherein a plurality of auxiliary thyristors are arranged antiparallel to each other.

FIG. 1 is a block and schematic representation of a firing circuit for two antiparallel-connected power thyristors 1 and 1'. A series circuit of auxiliary thyristors 2a, 2a' to 2d, 2d' is arranged in antiparallel pairs. Each antiparallel-connected pair of the auxiliary thyristors is shunted by one of a plurality of resistors 4a to 4d. Since the gate-cathode voltages of power thyristors 1 and 1' are negligible, the anode-cathode voltage of the power thyristors is essentially the voltage which is present across the series circuit consisting of the auxiliary thyristors 2a, 2a' to 2d, 2d'. This voltage is distributed and controlled by resistors 4a to 4d over the individual pairs of auxiliary thyristors. Resistors 4a to 4d have high resistance so that the current flowing through them is not sufficient to fire the power thyristors. However, when the voltage across the antiparallel circuit of power thyristors exceeds the sum of the breakdown voltages of the auxiliary thyristors in any direction, the auxiliary thyristors are rendered conductive. Thus, a firing current flows either via the cathode-gate path of power thyristor 1' and the series circuit of auxiliary thyristors 2a to 2d in the gate of the power thyristor, or via the gate-cathode path of power thyristor 1 and the series circuit of auxiliary thyristors 2a' to 2d' at the gate of power thyristor 1'. In this manner, a firing pulse is conducted to the gate of power thyristor 1 or 1' connected in the conductive direction, which switches the respective power thyristor into the conducting state.

In such a sequence of events, the gate-cathode path of power thyristor 1' or 1, respectively, carries firing current in the blocking direction. This is possible with a voltage drop of a few volts because the possibility of cutting off the gate-cathode path is quite small. The maximum cut-off current of the gate-cathode path for such power thyristors is generally fully sufficient as the firing current. Alternatively, however, diodes 6 and 6', which are shown in FIG. 1 by broken lines, can be connected antiparallel to the gate-cathode path of each power thyristor. In this manner, the firing current does not flow in the cut-off direction via the gate-cathode path of the power thyristor, but via diode 6 or diode 6'.

In the circuit of FIG. 1, the sum total of the breakdown voltages of thyristors 2a to 2d, and 2a' and 2d', respectively, is smaller than the breakdown voltage of power thyristor 1 and 1', respectively. It is thereby assured that the anode-cathode voltage of power thyristors 1 and 1' cannot rise above the zero breakdown voltages so that overhead firing as a result of excessive cathode-anode voltages is reliably prevented. Such overhead firing could lead to damage of power thyristors 1 and 1'. On the other hand, as noted, thyristors of lower power readings, such as auxiliary thyristors 2a to 2d and 2a' to 2d', are available which withstand overhead firing without damage.

The normal firing of power thyristors 1 and 1' is accomplished by firing auxiliary thyristors 2a to 2d and 2a'; to 2d', respectively, but not by overhead firing, but by a firing pulse at the gate or by light firing. In the specific embodiment of FIG. 1, auxiliary thyristors 2a to 2d and 2a' to 2d' are optically coupled to light-emitting diodes 3a to 3d which are connected in series and are addressed by an addressing unit A. This arrangement provides electrical separation between the auxiliary thyristors and the addressing units.

Figure 2:
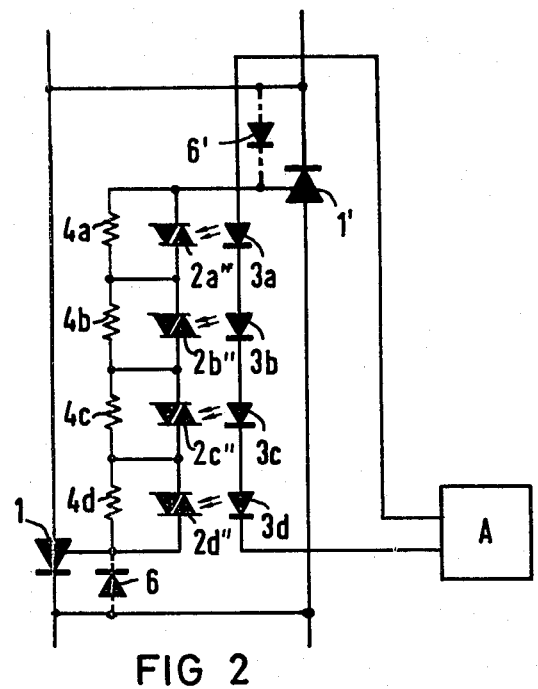
FIG. 2 is a block and schematic representation of an embodiment of the invention wherein triacs are used in the firing circuit.

FIG. 2 shows an embodiment of the invention which is similar to that described with respect to FIG. 1. In FIG. 2, each pair of antiparallel-connected auxiliary thyristors 2a, 2a' to 2d, 2d' is replaced by a single triac 2a'' to 2d'', respectively. Triacs 2a'' to 2d'' are optically coupled to light emitting diodes 3a to 3d which are addressed by driving circuit A, as noted with respect to FIG. 1.

Figure 3:
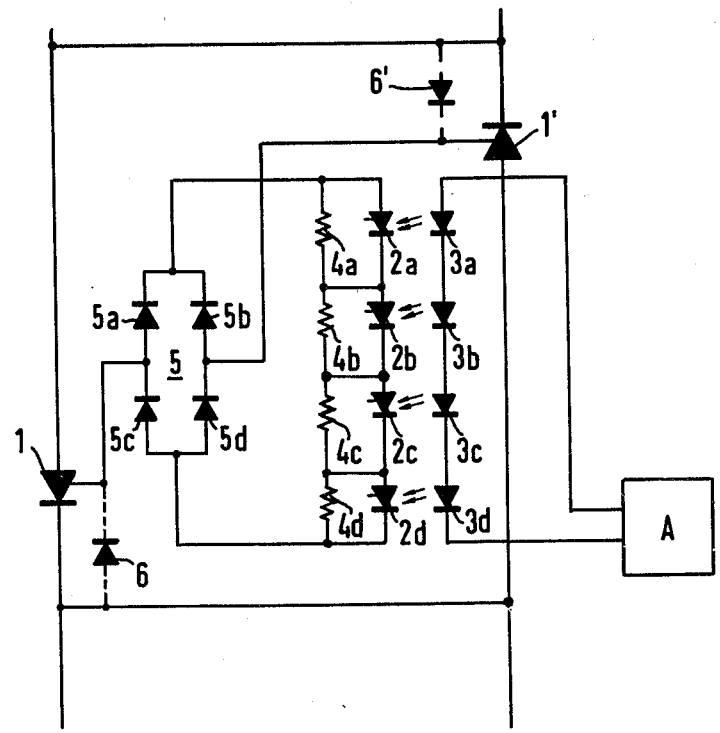
FIG. 3 is a block and schematic representation of an embodiment of the invention which utilizes a rectifier bridge in the firing circuit.

FIG. 3 shows a further embodiment of an inventive firing circuit for two antiparallel-connected power thyristors 1 and 1'. In this embodiment, the gates of power thyristors 1 and 1' are connected to respective inputs of a rectifier bridge circuit 5. The outputs of rectifier bridge circuit 5 are connected to the series combination of auxiliary thyristors 2a to 2d. The voltage between the gates of power thyristors 1 and 1', which corresponds essentially with the anode-cathode voltage, as already noted, is conducted to auxiliary thyristors 2a to 2d always with the same polarity. Thus, if the auxiliary thyristors fire as a result of overvoltage, a firing current flows through the auxiliary thyristors and rectifier bridge 5 from the gate of power thyristor 1 or 1'. For example, if an overvoltage is present in the conduction direction of power thyristor 1, then a firing current flows from the anode terminal of power thyristor 1, which is connected to the cathode terminal of power thyristor 1', through the cathode-gate path of power thyristor 1' in the reverse direction, or thyristor 6', through a diode 5b of rectifier bridge circuit 5, through auxiliary diodes 2a to 2d, through a diode 5c to bridge circuit 5, and through the gate-cathode path of power thyristor 1. This causes power thyristor 1 to fire before its anode-cathode voltage reaches a sufficient level to cause destructive overhead-type firing. As discussed hereinabove with respect to FIGS. 1 and 2, auxiliary thyristors 2a to 2d are normally fired by light control.

Although the invention has been described in terms of specific embodiments and applications, it is to be understood that persons skilled in the art, in light of this teaching, can produce additional embodiments without exceeding the scope or departing from the spirit of the claimed invention. Accordingly, the drawings and descriptions in this disclosure are proffered to facilitate comprehension of the invention and should not be construed to limit the scope thereof.

What is claimed is:

1. A firing circuit for a first power thyristor having anode, cathode, and gate terminals, the firing circuit having at least a first auxiliary thyristor means of the type having first and second terminals and which can withstand overhead firing thereacross, the first auxiliary thyristor means having an overhead firing voltage threshold which is lower than an overhead firing voltage threshold across the anode and cathode terminals of the first power thyristor, the first terminal of the first auxiliary thyristor means being connected to the gate terminal of the first power thyristor, the firing circuit further comprising:

a second power thyristor having anode, cathode, and gate terminals, and connected antiparallel across said anode and cathode terminals with respect to the anode and cathode terminals of the first power thyristor; and rectifier bridge means having a first terminal for connecting to the gate terminal of the first power thyristor, a second terminal for connecting to said gate terminal of said second power thyristor means, and third and fourth terminals for connecting across the first and second terminals of the first auxiliary thyristor means, the first auxiliary thyristor means being adapted to receive light pulses for firing the first auxiliary thyristor means.

2. A firing circuit for a first power thyristor having anode, cathode, and gate terminals, the firing circuit having at least a first auxiliary thyristor means of the type having first and second terminals and which can withstand overhead firing thereacross, the first auxiliary thyristor means having an overhead firing voltage threshold which is lower than a overhead firing voltage threshold across the anode and cathode terminals of the first power thyristor, the first terminal of the first auxiliary thyristor means being connected to the gate terminal of the first power thyristor, the firing circuit further comprising:

a second power thyristor having anode, cathode, and gate terminals and connected antiparallel across said anode and cathode terminals with respect to the anode and cathode terminals of the first power thyristor;

means for connecting the second terminal of the first auxiliary thyristor means to said gate terminal of said second power thyristor; and second auxiliary thyristor means having first and second terminals and connected antiparallel to the first auxiliary thyristor means, the first auxiliary thyristor means being adapted to receive light pulses for firing the first auxiliary thyristor means, the second auxiliary thyristor means being adapted to receive light pulses for firing the second auxiliary thyristor means.

3. A firing circuit of claim 2 wherein the antiparallel-connected combination of the first and said second auxiliary thyristor means comprises a triac.

4. The firing circuit of claim 1, 2 or 3 wherein there is further provided first and second diode means connected antiparallel to the gate-cathode path of the first power thyristor, and to said gate-cathode path of said second power thyristor, respectively.

5. The firing circuit of claim 1 or 2 wherein the first auxiliary thyristor means comprises a plurality of auxiliary thyristors connected in series.

6. The firing circuit of claim 5 wherein there is further provided a plurality of resistor means for shunting respective ones of said auxiliary thyristors.

* * * * *